US011264338B2

(12) United States Patent
Prabhakumar et al.

(10) Patent No.: US 11,264,338 B2
(45) Date of Patent: Mar. 1, 2022

(54) INTEGRATED CIRCUIT PACKAGE WITH THROUGH VOID GUARD TRACE

(71) Applicant: Intel Corporation, Santa Clara, CA (US)

(72) Inventors: Ananth Prabhakumar, Gilbert, AZ (US); Krishna Srinivasan, Chandler, AZ (US); Arnab Sarkar, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 830 days.

(21) Appl. No.: 15/934,191

(22) Filed: Mar. 23, 2018

(65) Prior Publication Data

US 2019/0295961 A1 Sep. 26, 2019

(51) Int. Cl.

| | |
|---|---|
| ***H01L 23/00*** | (2006.01) |
| ***H01L 23/525*** | (2006.01) |
| ***H01L 23/498*** | (2006.01) |
| ***H01L 23/64*** | (2006.01) |

(52) U.S. Cl.

CPC ........ *H01L 23/564* (2013.01); *H01L 23/5256* (2013.01)

(58) Field of Classification Search

CPC . H01L 23/26; H01L 23/14–142; H01L 23/13; H01L 2224/24225; H01L 25/117; H01L 23/3128; H01L 23/58–585; H01L 2224/20–22505; H01L 23/49822; H01L 23/564; H01L 2224/2499; H01L 2224/26–31; H01L 2224/1625; H01L 23/64

See application file for complete search history.

(56) References Cited

U.S. PATENT DOCUMENTS

2017/0330825 A1* 11/2017 Chou ..................... H01L 24/17

* cited by examiner

*Primary Examiner* — Sonya McCall-Shepard

(74) *Attorney, Agent, or Firm* — Schwabe, Williamson & Wyatt, P.C.

(57) ABSTRACT

Apparatuses, systems and methods associated with over void signal trace design are disclosed herein. In embodiments, an integrated circuit (IC) package may include a first layer that has a void and a guard trace, wherein a first portion of the void is located on a first side of the guard trace and a second portion of the void is located on a second side of the guard trace. The IC package may further include a second layer located adjacent to the first layer, wherein the second layer has a signal trace that extends along the guard trace. Other embodiments may be described and/or claimed.

25 Claims, 5 Drawing Sheets

300 404 414 320 302 406 414 402 306 306 410 304 322 308

INTEGRATED CIRCUIT PACKAGE WITH THROUGH VOID GUARD TRACE

TECHNICAL FIELD

The present disclosure relates to the field of electronic circuits. More particularly, the present disclosure relates to over void signal trace design.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Production of integrated circuit (IC) packages may include adhesion of multiple build-up layers and/or core layers together. During assembly processing of the build-up layers and/or core layers, outgassing of moisture may occur. If the IC packages are not designed to compensate for the outgassing of moisture, the IC packages may be damaged by the outgassing. To avoid damage due to outgassing of moisture, adhesion voids are required within the build-up layers and/or the core layers to allow for the outgassing of moisture. These adhesion voids are required to be certain sizes to ensure that there is not damage caused by the outgassing of moisture.

As the adhesion voids adversely impact the impedance of the signal traces located adjacent to the adhesion voids and negatively affect the quality of signals transmitted via the signal traces, legacy IC packages attempted to avoid placing signal traces adjacent to the adhesion voids. However, as IC packages continue to shrink and the number of signal traces within the IC packages continue to increase, it has become impossible to avoid placing signal traces adjacent to adhesion voids in many instances.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
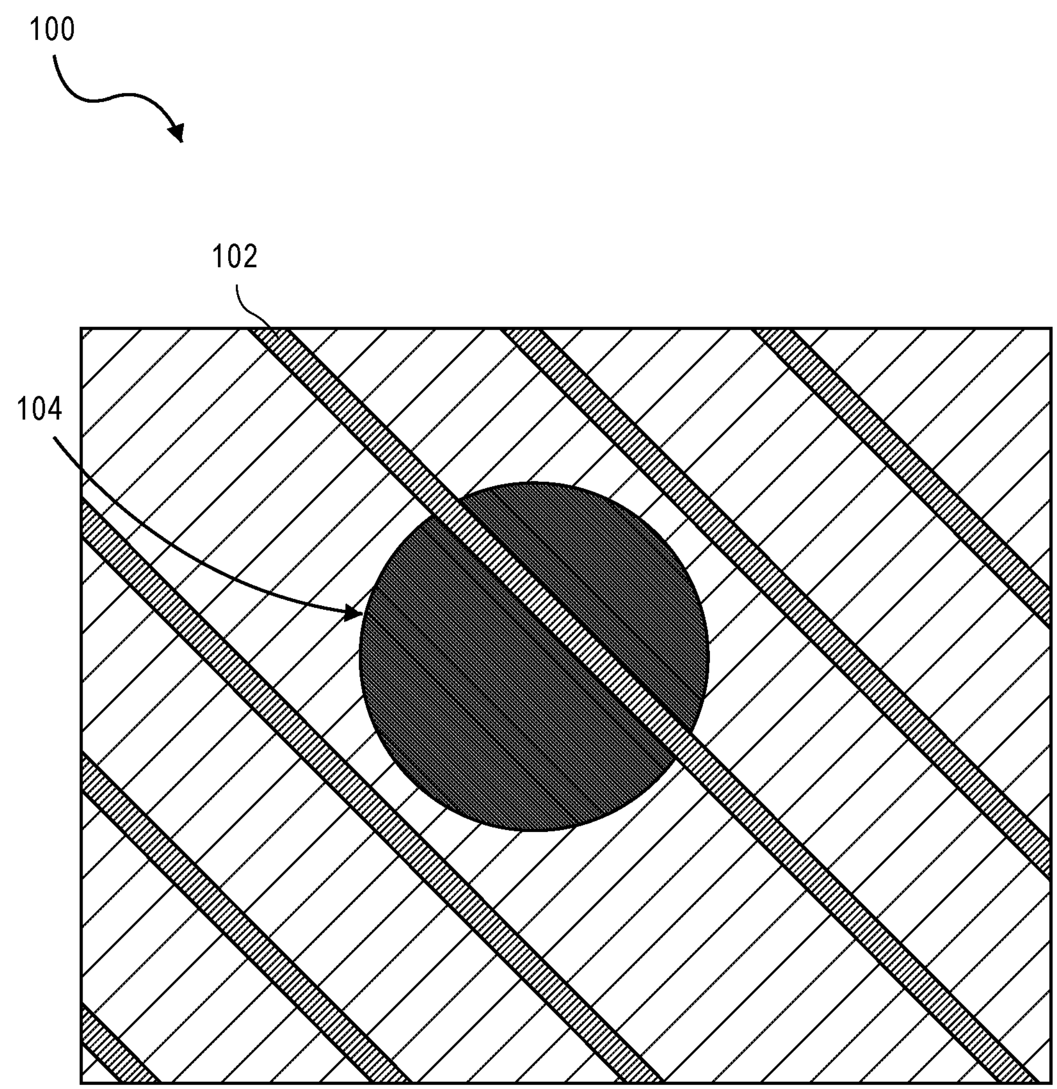
FIG. 1 illustrates a portion of an example legacy integrated circuit (IC) package with an over void signal trace.

Apparatuses, systems and methods associated with over void signal trace design are disclosed herein. In embodiments, an integrated circuit (IC) package may include a first layer that has a void and a guard trace, wherein a first portion of the void is located on a first side of the guard trace and a second portion of the void is located on a second side of the guard trace. The IC package may further include a second layer located adjacent to the first layer, wherein the second layer has a signal trace that extends along the guard trace.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 illustrates a portion of an example legacy integrated circuit (IC) package 100 with an over void signal trace. In particular, the IC package 100 includes a void 104 located in a first layer. The void 104 is required to be a certain width to allow for moisture outgassing, which may occur during assembly processing.

The IC package 100 further includes the signal trace 102 located in a second layer, wherein the second layer is located adjacent to the first layer. The signal trace 102 extends over the void 104. The signal trace 102 extending over the void 104 may adversely impact the impedance of the signal trace 102 and negatively affect the quality of signals transmitted via the signal trace 102, including high-speed signals. In particular, the discontinuity of the material in the first layer caused by the void 104 may adversely impact the impedance.

Figure 2:
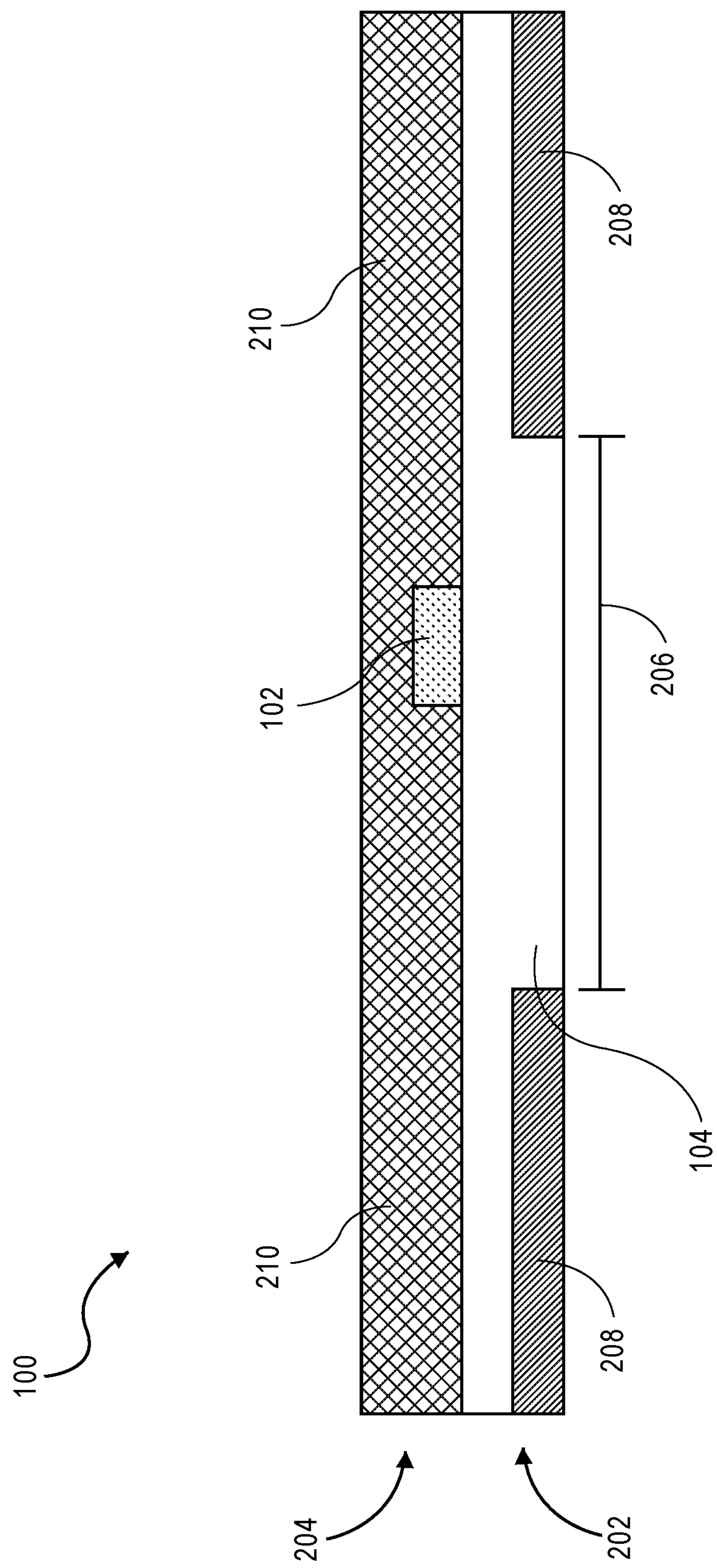
FIG. 2 illustrates a cross-sectional, side view of the example legacy IC package with the over void signal trace of FIG. 1.

FIG. 2 illustrates a cross-sectional, side view of the example legacy IC package 100 with the over void signal trace of FIG. 1. The IC package 100 includes a first layer 202 and a second layer 204. The second layer 204 is located adjacent to the first layer 202.

The first layer 202 includes the void 104. The void 104 comprises dielectric material that is encircled by a copper plane 208 of the first layer 202. The void 104 has a width 206 that is required to allow for moisture outgassing. Further, the width 206 defines an area of the void 104.

The second layer 204 includes the signal trace 102. The signal trace 102 comprises conductive metal located within non-conductive material 210. The signal trace 102 extends within the second layer 204 over the void 104.

Figure 3:
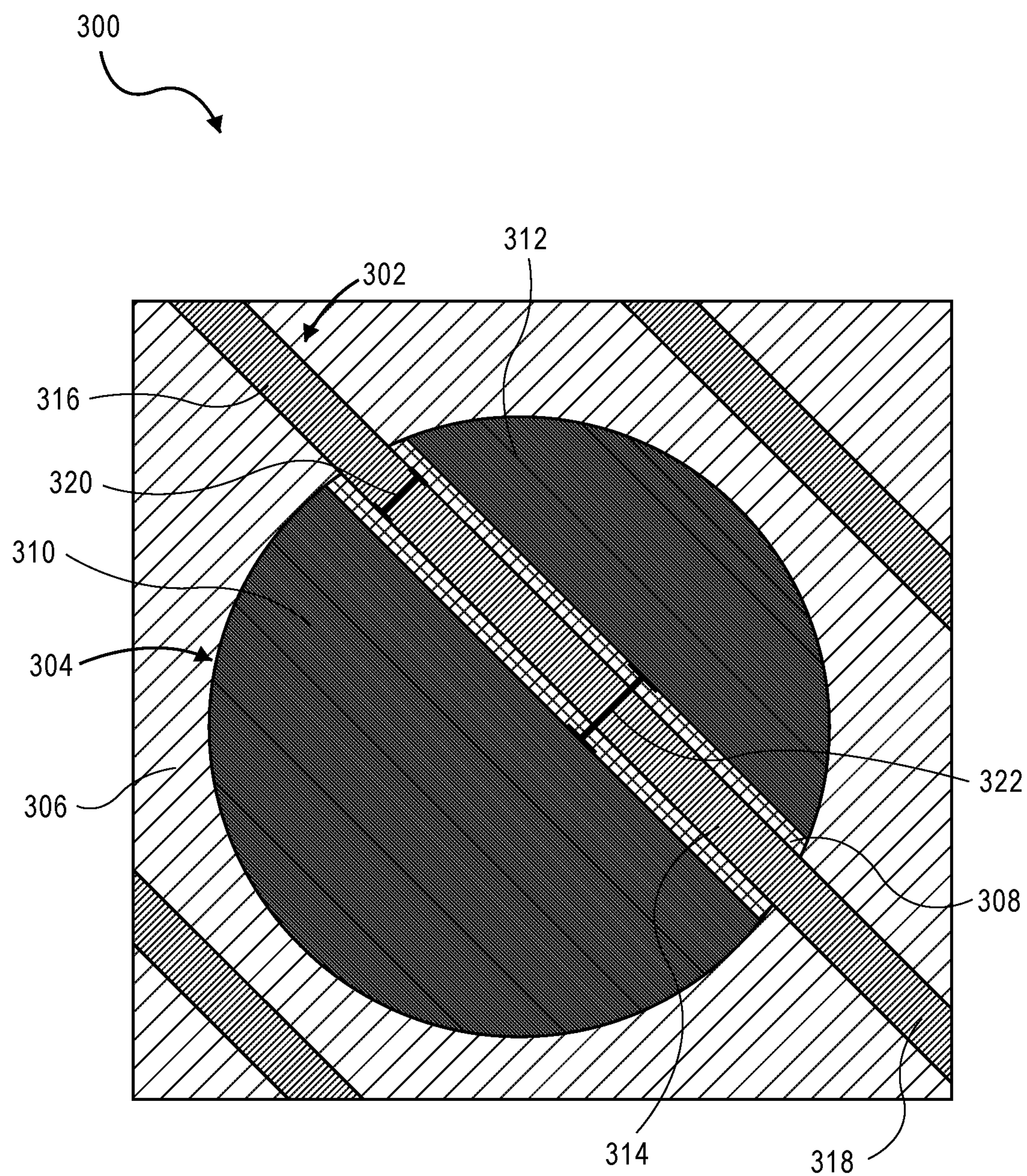
FIG. 3 illustrates a portion of an example IC package with an over void signal trace, according to various embodiments.

FIG. 3 illustrates a portion of an example IC package 300 with an over void signal trace, according to various embodiments. In particular, the portion of the IC package 300 may include a portion of a substrate of the IC package 300.

The portion of the IC package 300 may include more than one layer, such as build-up layers. The layers may be affixed to each other through an adhesion process. The illustrated embodiment shows features of a first layer and a second layer of the layers. The second layer may be located adjacent to the first layer, as is further described in relation to FIG. 4.

The first layer may have a void 304 located within material 306 of the first layer. The void 304 may comprise non-conductive material (such as dielectric material) and the material 306 may comprise conductive metal (such as copper, silver, gold, aluminum, alloys thereof, or some combination thereof). In some embodiments, the material 306 may comprise a metal plane (such as a copper plane and/or a ground plane) and the void 304 may comprise dielectric material that is encircled by the metal plane. Further, the void 304 may comprise an adhesion void that allows for outgassing of moisture during assembly processing of the IC package 300. The void 304 may have a circular profile, as illustrated. In other embodiments, the void 304 may have a profile corresponding to other shapes, including, but not limited to, a square, a rectangle, and/or an oval. While a single void 304 is illustrated within the first layer, it is to be understood that one or more voids may be located in the first layer that include one or more of the features of the void 304. Further, it is to be understood that one or more voids may be located in other layers of the IC package 300, wherein the voids in the other layers may include one or more of the features of the void 304. In some embodiments, one or more voids may be located in a core layer of the IC package 300, wherein the voids may include one or more of the features of the void 304.

The first layer may further include a guard trace 308. The guard trace 308 may extend through the void 304. For example, a first portion 310 of the void 304 may be located on a first side of the guard trace 308 and a second portion 312 of the void 304 may be located on a second side of the guard trace 308, the second side being opposite to the first side. The guard trace 308 may extend from a first portion of the exterior of the void 304 to a second portion of the exterior of the void 304.

The guard trace 308 may comprise conductive material. For example, the guard trace 308 may comprise conductive metal, such as silver, copper, gold, aluminum, alloys thereof, or some combination thereof. The guard trace 308 may comprise the same conductive metal as the material 306, may have the same metal properties as the material 306, may be the same thickness as the material 306, may be formed as part of a same process as the material 306, or some combination thereof. Further, the guard trace 308 may be coupled to the material 306 in some embodiments.

The second layer may include a signal trace 302. The signal trace 302 may extend across the guard trace 308, between the first portion 310 of the void 304 and the second portion 312 of the void 304. In particular, a first portion 314 of the signal trace 302 may extend across the guard trace 308 and may couple a second portion 316 of the signal trace 302 that is located at a first end of the guard trace 308 to a third portion 318 of the signal trace 302 that is located at a second end of the guard trace 308.

The signal trace 302 may comprise conductive material. For example, the signal trace 302 may comprise conductive metal, such as silver, copper, gold, aluminum, alloys thereof, or some combination thereof. The signal trace 302 may be utilized for transmission of a high-speed signal (for example, a signal with frequency of greater than 2 gigahertz. In other embodiments, the signal trace 302 may be utilized for transmission of a signal of any speed.

A width 322 of the guard trace 308 may be greater than or equal to a width 320 of the signal trace 302. For example, the width 322 of the guard trace 308 may be at least ten percent greater than the width 320 of the signal trace 302. In some embodiments, the guard trace 308 may be at least twice as wide as the signal trace 302. Further, in some embodiments, the width 320 of the signal trace 302 may be between 40 and 60 micrometers, and the width 322 of the guard trace 308 may be between 80 and 120 micrometers. The signal trace 302 may be located approximately (within 5% of the width) over a center of the guard trace 308, such that a first portion of the guard trace 308 is located on a first side of the signal trace 302 and a second portion of the guard trace 308 is located on a second side of the signal trace 302. The width 322 of the guard trace 308 being greater than the width 320 of the signal trace 302 may provide proper ground plane referencing of the signal trace 302.

The IC package 300 further may include dielectric material (see dielectric material 406 (FIG. 4) and dielectric material 414 (FIG. 4)). The dielectric material may encompass the signal trace 302, the material 306, the guard trace 308, or some portion thereof. A portion of the dielectric material may be located between the guard trace 308 and the signal trace 302. The dielectric material may separate the guard trace 308 and the signal trace 302. For example, the dielectric material may isolate the guard trace 308 from the signal trace 302 to prevent current flow between the guard trace 308 and the signal trace 302.

Figure 4:
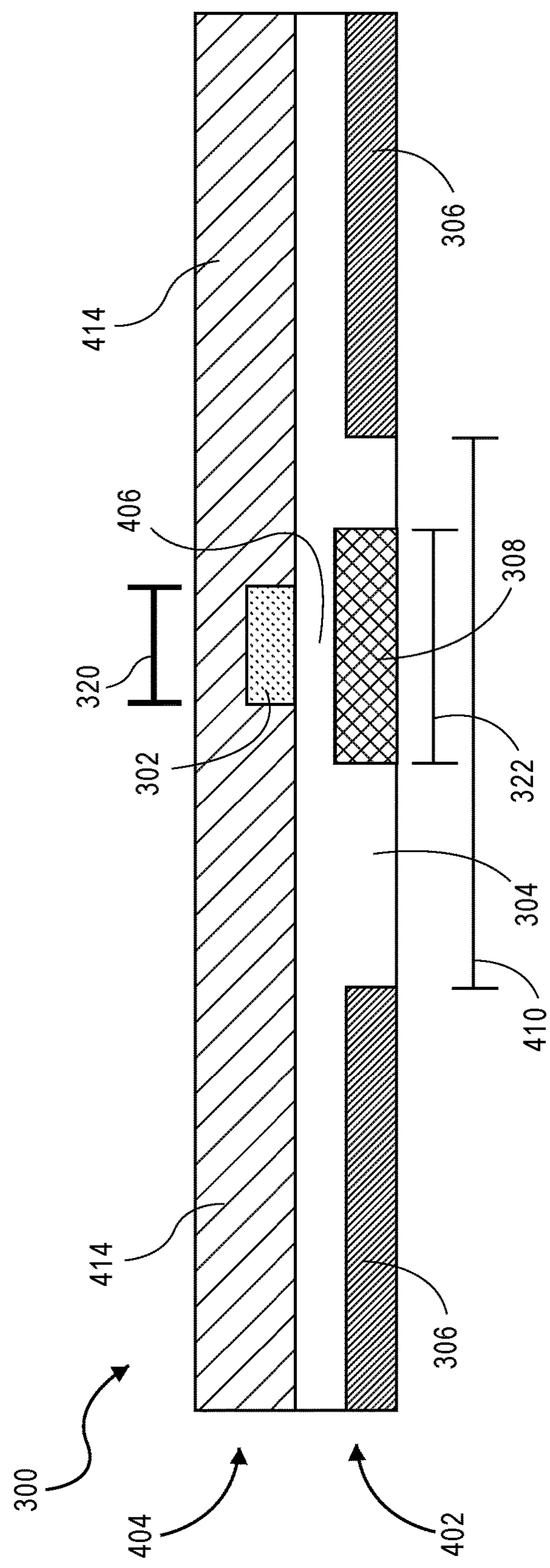
FIG. 4 illustrates a cross-sectional, side view of the example IC package with the over void signal trace, according to various embodiments.

FIG. 4 illustrates a cross-sectional, side view of the example IC package 300 with the over void signal trace, according to various embodiments. The IC package 300 may include one or more layers, such as build-up layers. In the illustrated embodiment, the IC package 300 includes a first layer 402 and a second layer 404. The second layer 404 may be located adjacent to the first layer 402.

The guard trace 308 and the void 304 may be located within the first layer 402. The first layer 402 may further include the material 306. The void 304 may comprise non-conductive material (such as dielectric material) and the material 306 may comprise conductive metal (such as copper, silver, gold, aluminum, alloys thereof, or some combination thereof). In some embodiments, the material 306 may comprise a metal plane (such as a copper plane and/or a ground plane) and the void 304 may comprise dielectric material encircled by the metal plane. The first layer 402 may further include dielectric material 406. The dielectric material 406 may encompass the guard trace 308, the material 306, or some portion thereof. The dielectric material 406 may comprise the same dielectric material comprising the void 304.

The void 304 may allow for moisture outgassing during assembly processing. The void 304 may have a width 410. The width 410 of the void 304 may be greater than the width 206 (FIG. 2) of the legacy void 104 (FIG. 1). For example, the width 410 of the void 304 may be increased such that the void 304 has an area equal to or greater than the void 104. In some embodiments, the width 410 of the void 304 may compensate for the area of the guard trace 308 that extends through the void 304. In some embodiments, the width 410 of the void may be greater than 200 micrometers.

The signal trace 302 may be located within the second layer 404. The signal trace 302 may be located over the guard trace 308. The signal trace 302 may be located approximately (within 5% of the width 322) over a center of the guard trace 308, such that a first portion of the guard trace 308 is located on a first side of the signal trace 302 and a second portion of the guard trace 308 is located on a second side of the signal trace 302. The signal trace 302 may reference the ground plane of the IC package 300 based on being located over the guard trace 308. Further, having the signal trace 302 located over the guard trace 308 may reduce or prevent adverse impacts to the impedance of the signal trace 302 that may be caused by the void 304.

The second layer 404 may further include dielectric material 414. The dielectric material 414 may comprise the same dielectric material as the dielectric material 406. The dielectric material 414 may at least partially encompass the signal trace 302. In the illustrated embodiment, the signal trace 302 is illustrated abutting the first layer 402. In other embodiments, a portion of the dielectric material 414 may be located between the signal trace 302 and the first layer 402.

A portion of the dielectric material 406, a portion of the dielectric material 414, or some combination thereof, (collectively referred to as "the dielectric material") may be located between the signal trace 302 and the guard trace 308. The dielectric material may separate the guard trace 308 and the signal trace 302. For example, the dielectric material may isolate the guard trace 308 from the signal trace 302 to prevent current flow between the guard trace 308 and the signal trace 302. In the illustrated embodiment, a portion of the dielectric material 406 located within the first layer 402 is illustrated being between the signal trace 302 and the guard trace 308. In other embodiments, a portion of the dielectric material 414 located within the second layer 404 may be between the signal trace 302 and the guard trace 308, or a portion of the dielectric material 406 located within the first layer 402 and a portion of the dielectric material 414 located within the second layer 404 may be located between the signal trace 302 and the guard trace 308.

While the illustrated embodiments relate to build-up layers, it is to be understood that the same concepts may be applied to stripline layer embodiments, where a void (such as the void 304) may be formed on a first surface of a stripline layer and a signal trace (such as the signal trace 302) may be formed on a second surface of the stripline layer. Further, the same concepts described herein may be applied to backside layers, where the backside layers may include one or more shadow voids that include one or more of the features of the void 304.

Additionally, while the illustrated embodiments describe a single signal trace (such as the signal trace 302) extending across a single guard trace (such as the guard trace 308), it is to be understood that multiple signal traces may extend across a single guard trace in other embodiments. For example, signal traces for a differential pair may comprise two signal traces that both extend across a single guard trace. In these embodiments, the multiple signal traces may be equally spaced over the guard trace.

Figure 5:
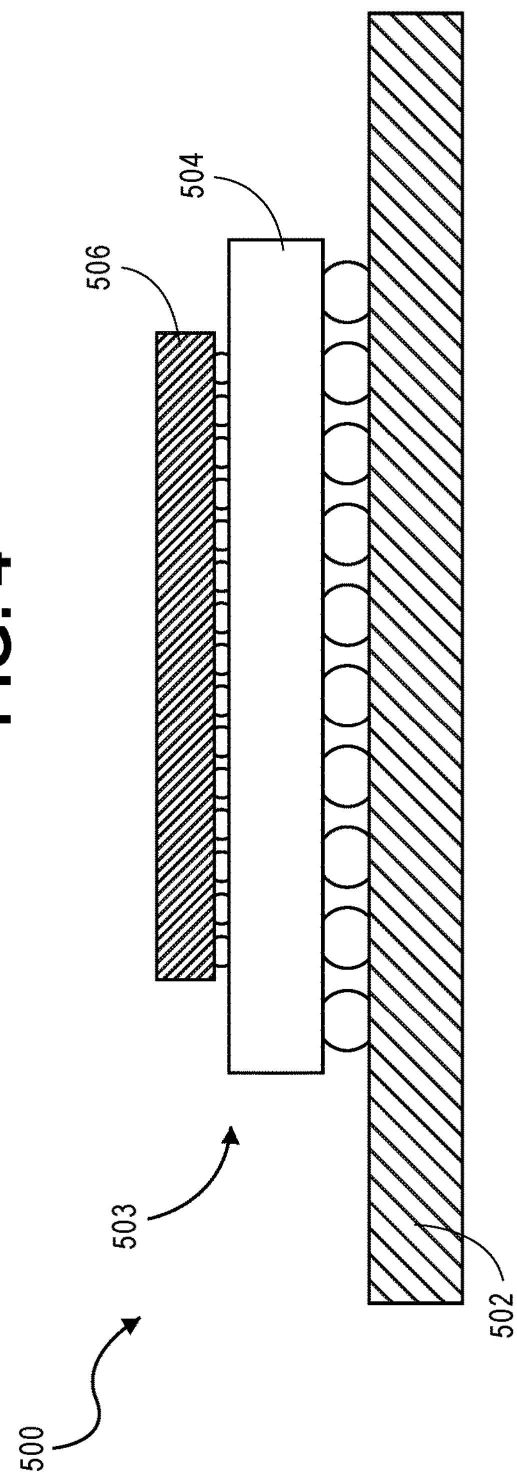
FIG. 5 illustrates an example printed circuit board arrangement, according to various embodiments.

FIG. 5 illustrates an example printed circuit board (PCB) arrangement 500, according to various embodiments. The PCB arrangement 500 may include a PCB 502. The PCB 502 may include one or more layers of non-conductive material. One or more conductive elements (such as electrical traces, vias, pads, and/or other electrically-conductive elements) may be dispersed within the layers of the non-conductive material and/or affixed to surfaces of the layers of the non-conductive material. The conductive elements may be utilized for routing electricity and/or electrical signals among elements coupled to the PCB 502.

The PCB arrangement 500 may further include an IC package 503 mounted to the PCB 502. The IC package may include a substrate 504 and a die 506. The substrate 504 may be coupled to the PCB 502. The substrate 504 may include a plurality of layers, such as build-up layers. The layers, or some portion thereof, may comprise non-conductive material. The substrate 504 may further include one or more conductive elements (such as electrical traces, vias, pads, and/or other electrically-conductive elements) that extend within, through, and/or on the layers. The conductive elements may be utilized for routing electrical signals between the PCB 502 and the die 506. The layers of the substrate 504 may include one or more of the features of the first layer 402 (FIG. 4) and/or the second layer 404 (FIG. 4). For example, the layers of the substrate may include one or more voids (such as the void 304 (FIG. 3)), guard traces (such as the guard trace 308 (FIG. 3)), signal traces (such as the signal trace 302 (FIG. 3)), dielectric material (such as the dielectric material 406 (FIG. 4)), or some combination. The voids, guard traces, signal traces, and dielectric material, or some portion thereof, may be arranged as described in relation to FIGS. 3 and 4.

The die 506 may be coupled to the substrate 504. The substrate 504 may provide route one or more electrical signals between the PCB 502 and the die 506. The die 506 may comprise a semiconductor material. The die 506 may include circuitry to perform one or more functions on the electrical signals provided by the substrate 504 and may provide a result of the function to the substrate 504 for routing to the PCB 502. In the illustrated embodiment, there is a single die coupled to the substrate 504. In other embodiments, there may be more than one die coupled to the substrate 504, wherein each of the dies may include one or more of the properties of the die 506.

Figure 6:
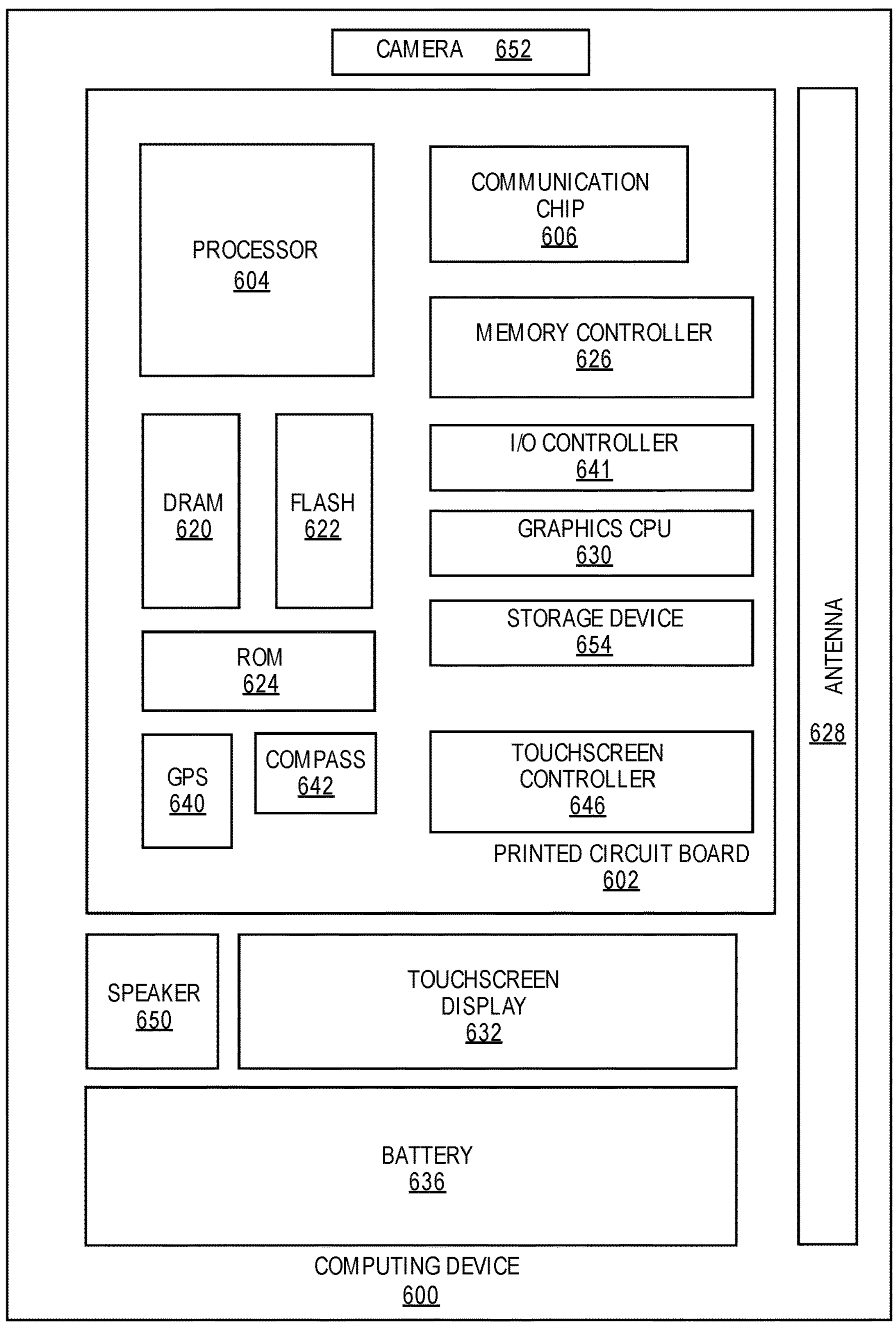
FIG. 6 illustrates an example computer device that may employ the apparatuses and/or methods described herein, according to various embodiments.

FIG. 6 illustrates an example computer device 600 that may employ the apparatuses and/or methods described herein (e.g., the portion of the IC package 300, and/or the PCB arrangement 500), in accordance with various embodiments. In particular, one or more of the components of the computer device 600 may include layers that include one or more of the features of the first layer 402 (FIG. 4) and/or the second layer 404 (FIG. 4), such as the void 304 (FIG. 3), the guard trace 308 (FIG. 3), the signal trace 302 (FIG. 3), the dielectric material 406 (FIG. 4), or some combination thereof. As shown, computer device 600 may include a number of components, such as one or more processor(s) 604 (one shown) and at least one communication chip 606. In various embodiments, the one or more processor(s) 604 each may include one or more processor cores. In various embodiments, the at least one communication chip 606 may be physically and electrically coupled to the one or more processor(s) 604. In further implementations, the communication chip 606 may be part of the one or more processor (s) 604. In various embodiments, computer device 600 may include printed circuit board (PCB) 602. For these embodiments, the one or more processor(s) 604 and communication chip 606 may be disposed thereon. In alternate embodiments, the various components may be coupled without the employment of PCB 602.

Depending on its applications, computer device 600 may include other components that may or may not be physically and electrically coupled to the PCB 602. These other components include, but are not limited to, memory controller 626, volatile memory (e.g., dynamic random access memory (DRAM) 620), non-volatile memory such as read only memory (ROM) 624, flash memory 622, storage device 654 (e.g., a hard-disk drive (HDD)), an I/O controller 641, a digital signal processor (not shown), a crypto processor (not shown), a graphics processor 630, one or more antenna 628, a display (not shown), a touch screen display 632, a touch screen controller 646, a battery 636, an audio codec (not shown), a video codec (not shown), a global positioning system (GPS) device 640, a compass 642, an accelerometer (not shown), a gyroscope (not shown), a speaker 650, a camera 652, and a mass storage device (such as hard disk drive, a solid state drive, compact disk (CD), digital versatile disk (DVD)) (not shown), and so forth.

In some embodiments, the one or more processor(s) 604, flash memory 622, and/or storage device 654 may include associated firmware (not shown) storing programming instructions configured to enable computer device 600, in response to execution of the programming instructions by one or more processor(s) 604, to practice all or selected aspects of the methods described herein. In various embodiments, these aspects may additionally or alternatively be implemented using hardware separate from the one or more processor(s) 604, flash memory 622, or storage device 654.

The communication chips 606 may enable wired and/or wireless communications for the transfer of data to and from the computer device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to IEEE 802.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 600 may include a plurality of communication chips 606. For instance, a first communication chip 606 may be dedicated to shorter range wireless communications such as Wi-Fi and Bluetooth, and a second communication chip 606 may be dedicated to longer range wireless communications such as GPS, EDGE, GPRS, CDMA, WiMAX, LTE, Ev-DO, and others.

In various implementations, the computer device 600 may be a laptop, a netbook, a notebook, an ultrabook, a smartphone, a computer tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computer device 600 may be any other electronic device that processes data.

Example 1 may include an integrated circuit (IC) package, comprising a first layer that has a void and a guard trace, wherein a first portion of the void is located on a first side of the guard trace and a second portion of the void is located on a second side of the guard trace, and a second layer located adjacent to the first layer, wherein the second layer has a signal trace that extends along the guard trace.

Example 2 may include the IC package of example 1, further comprising a dielectric material located between the guard trace and signal trace, wherein the dielectric material separates the signal trace from the guard trace.

Example 3 may include the IC package of example 1 or 2, wherein the guard trace is at least twice as wide as the signal trace.

Example 4 may include the IC package of example 1 or 2, wherein a width of the guard trace is at least ten percent greater than a width of the signal trace.

Example 5 may include the IC package of example 1 or 2, wherein a width of the signal trace is between 40 and 60 micrometers, and wherein a width of the guard trace is between 80 and 120 micrometers.

Example 6 may include the IC package of example 5, wherein a width of the void is greater than 200 micrometers.

Example 7 may include the IC package of example 1 or 2, wherein the IC package further includes a ground plane of a type of conductive metal, and wherein the guard trace is of the type of conductive metal.

Example 8 may include the IC package of example 7, wherein the void is encircled by the ground plane.

Example 9 may include the IC package of example 1 or 2, wherein the void is an adhesion void.

Example 10 may include the IC package of example 1 or 2, wherein the signal trace is to be utilized for transmission of a high-speed signal.

Example 11 may include a computer device, comprising a circuit board, and an integrated circuit (IC) package mounted to the circuit board, wherein the IC package includes a first layer that has a void and a guard trace, wherein a first portion of the void is located on a first side of the guard trace and a second portion of the void is located on a second side of the guard trace, and a second layer located adjacent to the first layer, wherein the second layer has a signal trace that extends along the guard trace.

Example 12 may include the computer device of example 11, wherein the IC package further includes a dielectric material located between the guard trace and signal trace, and wherein the dielectric material isolates the signal trace from the guard trace.

Example 13 may include the computer device of example 11 or 12, wherein the guard trace is at least twice as wide as the signal trace.

Example 14 may include the computer device of example 11 or 12, wherein a width of the guard trace is at least ten percent greater than a width of the signal trace.

Example 15 may include the computer device of example 11 or 12, wherein a width of the signal trace is between 40 and 60 micrometers, and wherein a width of the guard trace is between 80 and 120 micrometers.

Example 16 may include the computer device of example 15, wherein a width of the void is greater than 200 micrometers.

Example 17 may include the computer device of example 11 or 12, wherein the IC package further includes a ground plane of a type of conductive metal, and wherein the guard trace is of the type of conductive metal.

Example 18 may include the computer device of example 17, wherein the void is encircled by the ground plane.

Example 19 may include the computer device of example 11 or 12, wherein the void is an adhesion void.

Example 20 may include the computer device of example 11 or 12, wherein the signal trace is to be utilized for transmission of a high-speed signal.

Example 21 may include a substrate for an integrated circuit package, comprising a first layer that has a void and a guard trace, wherein a first portion of the void is located on a first side of the guard trace and a second portion of the void is located on a second side of the guard trace, and a second layer located adjacent to the first layer, wherein the second layer has a signal trace that extends along the guard trace.

Example 22 may include the substrate of example 21, further comprising a dielectric material located between the guard trace and signal trace, wherein the dielectric material separates the signal trace from the guard trace.

Example 23 may include the substrate of example 21 or 22, wherein the guard trace is at least twice as wide as the signal trace.

Example 24 may include the substrate of example 21 or 22, wherein a width of the signal trace is between 40 and 60 micrometers, and wherein a width of the guard trace is between 80 and 120 micrometers.

Example 25 may include the substrate of example 21 or 22, wherein the substrate further includes a ground plane of a type of conductive metal, and wherein the guard trace is of the type of conductive metal.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. An integrated circuit (IC) package, comprising:

a first layer that has a void and a guard trace, wherein a first portion of the void is located on a first side of the guard trace and a second portion of the void is located on a second side of the guard trace, the first portion of the void having a first widest width, and the second portion of the void having a second widest width greater than the first widest width, and wherein the guard trace has a width; and a second layer located adjacent to the first layer, wherein the second layer has a signal trace that extends along the guard trace, and wherein the signal trace has a width less than the width of the guard trace.

2. The IC package of claim 1, further comprising a dielectric material located between the guard trace and signal trace, wherein the dielectric material separates the signal trace from the guard trace.

3. The IC package of claim 1, wherein the guard trace is at least twice as wide as the signal trace.

4. The IC package of claim 1, wherein a width of the guard trace is at least ten percent greater than a width of the signal trace.

5. The IC package of claim 1, wherein a width of the signal trace is between 40 and 60 micrometers, and wherein a width of the guard trace is between 80 and 120 micrometers.

6. The IC package of claim 5, wherein a width of the void is greater than 200 micrometers.

7. The IC package of claim 1, wherein the IC package further includes a ground plane of a type of conductive metal, and wherein the guard trace is of the type of conductive metal.

8. The IC package of claim 7, wherein the void is encircled by the ground plane.

9. The IC package of claim 1, wherein the void is an adhesion void.

10. The IC package of claim 1, wherein the signal trace is to be utilized for transmission of a high-speed signal.

11. A computer device, comprising:

a circuit board; and an integrated circuit (IC) package mounted to the circuit board, wherein the IC package includes:

a first layer that has a void and a guard trace, wherein a first portion of the void is located on a first side of the guard trace and a second portion of the void is located on a second side of the guard trace, the first portion of the void having a first widest width, and the second portion of the void having a second widest width greater than the first widest width, and wherein the guard trace has a width; and a second layer located adjacent to the first layer, wherein the second layer has a signal trace that extends along the guard trace, and wherein the signal trace has a width less than the width of the guard trace.

12. The computer device of claim 11, wherein the IC package further includes a dielectric material located between the guard trace and signal trace, and wherein the dielectric material isolates the signal trace from the guard trace.

13. The computer device of claim 11, wherein the guard trace is at least twice as wide as the signal trace.

14. The computer device of claim 11, wherein a width of the guard trace is at least ten percent greater than a width of the signal trace.

15. The computer device of claim 11, wherein a width of the signal trace is between 40 and 60 micrometers, and wherein a width of the guard trace is between 80 and 120 micrometers.

16. The computer device of claim 15, wherein a width of the void is greater than 200 micrometers.

17. The computer device of claim 11, wherein the IC package further includes a ground plane of a type of conductive metal, and wherein the guard trace is of the type of conductive metal.

18. The computer device of claim 17, wherein the void is encircled by the ground plane.

19. The computer device of claim 11, wherein the void is an adhesion void.

20. The computer device of claim 11, wherein the signal trace is to be utilized for transmission of a high-speed signal.

21. A substrate for an integrated circuit package, comprising:

a first layer that has a void and a guard trace, wherein a first portion of the void is located on a first side of the guard trace and a second portion of the void is located on a second side of the guard trace, the first portion of the void having a first widest width, and the second portion of the void having a second widest width greater than the first widest width, and wherein the guard trace has a width; and a second layer located adjacent to the first layer, wherein the second layer has a signal trace that extends along the guard trace, and wherein the signal trace has a width less than the width of the guard trace.

22. The substrate of claim 21, further comprising a dielectric material located between the guard trace and signal trace, wherein the dielectric material separates the signal trace from the guard trace.

23. The substrate of claim 21, wherein the guard trace is at least twice as wide as the signal trace.

24. The substrate of claim 21, wherein a width of the signal trace is between 40 and 60 micrometers, and wherein a width of the guard trace is between 80 and 120 micrometers.

25. The substrate of claim 21, wherein the substrate further includes a ground plane of a type of conductive metal, and wherein the guard trace is of the type of conductive metal.

* * * * *